US012610696B2

(12) United States Patent
Yang et al.

(10) Patent No.: US 12,610,696 B2
(45) Date of Patent: Apr. 21, 2026

(54) DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Cheng Yang, Wuhan (CN); Junpu Tang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 590 days.

(21) Appl. No.: 17/604,775

(22) PCT Filed: Sep. 2, 2021

(86) PCT No.: PCT/CN2021/116180
§ 371 (c)(1),
(2) Date: Oct. 19, 2021

(87) PCT Pub. No.: WO2023/015625
PCT Pub. Date: Feb. 16, 2023

(65) Prior Publication Data
US 2024/0023383 A1 Jan. 18, 2024

(30) Foreign Application Priority Data

Aug. 13, 2021 (CN) .......................... 202110932973.9

(51) Int. Cl.
H10K 59/124 (2023.01)
H10K 59/80 (2023.01)

(52) U.S. Cl.
CPC ......... H10K 59/124 (2023.02); H10K 59/871 (2023.02); H10K 59/8791 (2023.02); H10K 59/8794 (2023.02)

(58) Field of Classification Search
CPC ............. H10K 59/124; H10K 59/8791; H10K 59/8794; H10K 59/871; H10K 59/65; H10K 59/877; H10K 59/50; H10K 59/12
(Continued)

(56) References Cited

U.S. PATENT DOCUMENTS

2008/0061390 A1* 3/2008 Swain .............. H01L 27/14818
257/E31.128
2015/0194634 A1 7/2015 Kang et al.
(Continued)

FOREIGN PATENT DOCUMENTS

CN 203117607 U 8/2013
CN 110676296 A * 1/2020 .......... H01L 27/3211
(Continued)

OTHER PUBLICATIONS

Yu, Feng, Display Panel and Display Device, Jan. 10, 2020 (Year: 2020).*

*Primary Examiner* — Jacob Y Choi
*Assistant Examiner* — Ashley Nicole Blackwell
(74) *Attorney, Agent, or Firm* — PV IP PC; Christopher S. Ruprecht; Wei Te Chung

(57) ABSTRACT

Provided is a display device. The display device includes: a first functional layer, a display panel, and a second functional layer. The display panel is disposed on the first functional layer and is defined with a first display region and a second display region. The second display region includes a light transmitting region. The second functional layer is disposed on the display panel. The display device further includes a first film layer, provided with a plurality of
(Continued)

100 opaque or translucent particles arranged irregularly at a position corresponding to the light transmitting region of the second display region. The display device can alleviate the diffraction problem of the camera under panel (CUP) technology of a full screen.

12 Claims, 4 Drawing Sheets

(58) Field of Classification Search
    USPC ........................................................ 257/72
    See application file for complete search history.

(56) References Cited

U.S. PATENT DOCUMENTS

| 2015/0311474 | A1* | 10/2015 | Basil | ...................... | H10K 71/00 |
| | | | | | 257/40 |
| 2016/0365393 | A1* | 12/2016 | Kim | ................... | H10K 59/8792 |
| 2021/0193769 | A1* | 6/2021 | Bok | ...................... | H01L 25/167 |
| 2021/0408511 | A1* | 12/2021 | Qin | ........................ | H10K 71/00 |

FOREIGN PATENT DOCUMENTS

| CN | 211529178 | U | 9/2020 |
| CN | 113156681 | A | 7/2021 |

\* cited by examiner

DISPLAY DEVICE

FIELD OF INVENTION

The present disclosure relates to display technologies, and more particularly, to a display device.

BACKGROUND OF INVENTION

In recent years, the pursuit of "full screen" with high screen ratio and ultra-narrow frame has become a hot spot in the field of small-size display screens. The advantage of "full screen" lies in maximizing the use of the displaying area of the screen and bringing better visual experience to users. The arrangement of positions of a front camera, an ambient light sensor, an earpiece, and other photosensitive devices in mobile phones, flat panels, and other display devices is a difficult point in the design of "full screen". Among the bang screens, water-drop screens, and circular dug screens existing in the market, the screen ratio may still decrease because the opening region used for placing front-camera elements has no pixels and no display function. At present, the new technology of camera under panel (CUP) cameras applies the design of an organic light-emitting diode (OLED) display screen with a high screen ratio. The screen has pixels corresponding to the region where an imaging optical module is placed and has a display function, so as to improve the integrity of screen display and become a real full screen to bring better visual experience.

The imaging optical module at the front part of the full screen display device is arranged beneath the display screen, and the corresponding region can display normally. This region has structures such as circuits and pixels of display units arranged periodically, with the smallest display unit being pixels, usually several microns to several hundred microns. Because these structures are translucent or opaque structures arranged regularly, when light passes through this region and reaches the imaging optical module, the structures may produce an obvious diffraction effect and form diffraction spots, which may bring distortion of collected data and poor imaging of the optical module.

SUMMARY OF INVENTION

The imaging optical module at the front part of the full screen display device is arranged beneath the display screen, and this region has a structure of circuits and pixels of display units arranged periodically. Because these structures are translucent or opaque structures arranged regularly, when light passes through this region and reaches the imaging optical module, the structures may produce an obvious diffraction effect and form diffraction spots, which may bring distortion of collected data and poor imaging of the optical module.

An objective of the present disclosure lies in providing a display device, configured to alleviate the diffraction problem of the CUP technology of a full screen, thereby having a better imaging effect.

To resolve the described problem, the present disclosure provides a display device. The display device includes: a first functional layer; a display panel, disposed on the first functional layer and including a first display region and a second display region, wherein the second display region includes a light transmitting region; and a second functional layer, disposed on the display panel.

The display device further includes a first film layer, provided with a plurality of opaque or translucent particles arranged irregularly at a position corresponding to the light transmitting region of the second display region.

In some embodiments, the first film layer is located between at least one of between the first functional layer and the display panel or between the second functional layer and the display panel.

In some embodiments, the first film layer is at least one of the first functional layer or the second functional layer.

In some embodiments, the display panel includes: a substrate, located on the first functional layer; an active layer, disposed on the substrate; a first insulation layer, covering the active layer; a first gate metal layer, disposed on the first insulation layer; a second insulation layer, covering the first insulation layer and the first gate metal layer; a second gate metal layer, disposed on the second insulation layer; a third insulation layer, covering the second insulation layer and the second gate metal layer; a source-drain layer, disposed on the third insulation layer; and a first flat layer, covering the third insulation layer and the source-drain layer, wherein the second functional layer is disposed on the first flat layer.

In some embodiments, the first film layer is in same layer as at least one of the active layer, the first gate metal layer, the second gate metal layer, and the source-drain layer.

In some embodiments, the first film layer has same material with the at least one film layer in the same layer.

In some embodiments, the first film layer is in same layer as at least two of the active layer, the first gate metal layer, the second gate metal layer, and the source-drain layer, and the opaque or translucent particles located in different layers are staggered from each other in a top view.

In some embodiments, the third insulation layer is provided with a plurality of first through holes arranged irregularly at a position corresponding to the second display region, the first film layer at least fills in the first through holes, is in same layer as and has same material with the first flat layer.

In some embodiments, a shape of the irregularly arranged opaque or translucent particles includes at least one of a rectangle or a circle.

In some embodiments, a diameter or a side length of the irregularly arranged opaque or translucent particles is in a range of 1.5 μm to 10 μm.

In some embodiments, the first functional layer includes at least one of a backplane, a heat dissipating copper foil, or a supporting stainless steel plate; and the second functional layer includes at least one of a touch panel, a polarizer, or cover glass.

The present disclosure further provides a display device. The display device includes: a first functional layer; a display panel, disposed on the first functional layer and including a first display region and a second display region, wherein the second display region includes a light transmitting region; and a second functional layer, disposed on the display panel.

The display device further includes a first film layer, provided with a plurality of opaque or translucent particles arranged irregularly at a position corresponding to the light transmitting region of the second display region, wherein particle sizes of the irregularly arranged opaque or translucent particles are in a range of 1.5 μm to 10 μm.

In some embodiments, the first film layer is located between at least one of between the first functional layer and the display panel or between the second functional layer and the display panel.

In some embodiments, the first film layer is at least one of the first functional layer or the second functional layer.

In some embodiments, the display panel includes: a substrate, located on the first functional layer; an active layer, disposed on the substrate; a first insulation layer, covering the active layer; a first gate metal layer, disposed on the first insulation layer;

a second insulation layer, covering the first insulation layer and the first gate metal layer; a second gate metal layer, disposed on the second insulation layer; a third insulation layer, covering the second insulation layer and the second gate metal layer; a source-drain layer, disposed on the third insulation layer; and a first flat layer, covering the third insulation layer and the source-drain layer, wherein the second functional layer is disposed on the first flat layer.

In some embodiments, the first film layer is in same layer as at least one of the active layer, the first gate metal layer, the second gate metal layer, and the source-drain layer.

In some embodiments, the first film layer has same material with the at least one film layer in the same layer.

In some embodiments, the first film layer is in same layer as at least two of the active layer, the first gate metal layer, the second gate metal layer, and the source-drain layer, and the opaque or translucent particles located in different layers are staggered from each other in a top view.

In some embodiments, the third insulation layer is provided with a plurality of first through holes arranged irregularly at a position corresponding to the second display region, the first film layer at least fills in the first through holes, is in same layer as and has same material with the first flat layer.

In some embodiments, the first functional layer includes at least one of a backplane, a heat dissipating copper foil, or a supporting stainless steel plate; and the second functional layer includes at least one of a touch panel, a polarizer, or cover glass.

The beneficial effects of the present disclosure are that: The display device of the present disclosure includes a first film layer, provided with a plurality of opaque or translucent particles arranged irregularly at a position corresponding to the light transmitting region of the second display region.

By adding the irregularly arranged opaque or translucent particles to the film structure corresponding to the second display region, the irregularly arranged opaque or translucent particles are distributed between the regularly arranged pixels and circuits, thereby destroying the regular arrangement and further alleviating the diffraction phenomenon caused by the regular arrangement. Therefore, the display device can alleviate the diffraction problem of the CUP technology of a full screen.

BRIEF DESCRIPTION OF DRAWINGS

To describe the technical solutions in the embodiments of the present disclosure more clearly, the following briefly describes accompanying drawings required for describing the embodiments. Apparently, the accompanying drawings in the following descriptions show merely some embodiments of the present disclosure, and a person skilled in the art may still derive other accompanying drawings from these accompanying drawings without creative efforts.

DETAILED DESCRIPTION OF PREFERRED EMBODIMENTS

The following clearly and completely describes technical solutions in embodiments of the present disclosure with reference to the accompanying drawings in the embodiments of the present disclosure. Apparently, the described embodiments are only some embodiments rather than all the embodiments of the present disclosure. All other embodiments obtained by a person skilled in the art based on the embodiments of the present disclosure without creative efforts shall fall within the protection scope of the present disclosure.

In the description of the present disclosure, it should be understood that orientation or position relationships indicated by terms such as "center", "longitudinal", "transverse", "length", "width", "thickness", "on", "below", "front", "back", "left", "right", "vertical", "horizontal", "top", "bottom", "inside", "outside", "clockwise", and "anticlockwise" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of the present disclosure. In addition, terms "first" and "second" are used merely for the purpose of description, and shall not be construed as indicating or implying relative importance or implying a quantity of indicated technical features. Thus, features defined by "first" and "second" may explicitly or implicitly include one or more of the features. In the descriptions of the present disclosure, "a plurality of" means two or more, unless otherwise definitely and specifically limited.

Many different implementations or examples are provided below to implement different structures of the present disclosure. To simplify the disclosure of the present disclosure, the following describes components and settings of particular examples. Certainly, the components and settings are merely examples, and are not intended to limit the present disclosure. In addition, in the present disclosure, reference numbers and/or reference letters may be repeated in different examples. Such repetition is intended to simplify and clarify this application, and does not indicate a relationship between various implementations and/or settings that are discussed. In addition, the present disclosure provides examples of various specific processes and materials, but a person of ordinary skill in the art may be aware of the applicability of other processes and/or the use of other materials.

The technical solutions of the present disclosure are described with reference to specific embodiments.

Figure 1:
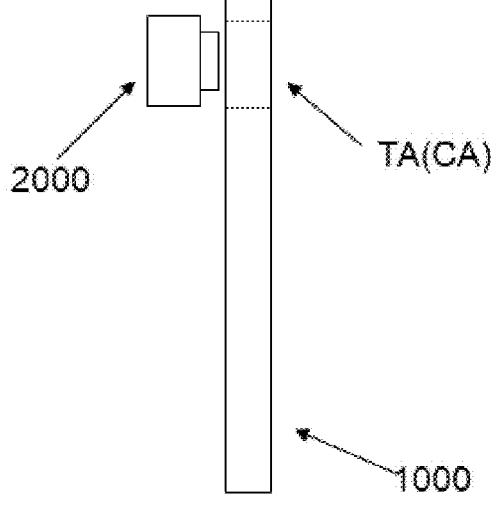
FIG. 1 is a schematic diagram of a correspondence between an imaging optical module and a display device according to an embodiment of the present disclosure.
Figure 2:
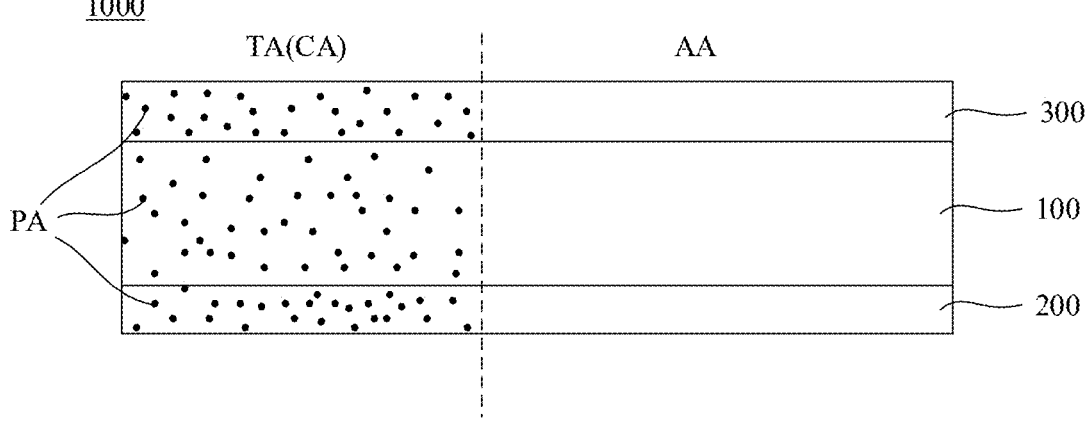
FIG. 2 is a schematic diagram of a cross-sectional structure of a display device according to an embodiment of the present disclosure.

As shown in FIGS. 1 and 2, the present disclosure provides a display device 1000, including a first functional layer 200, a display panel 100, and a second functional layer 300. The display panel 100 is disposed on the first functional layer 200 and includes a first display region AA and a second display region CA. The second display region CA includes a light transmitting region TA. The second functional layer 300 is disposed on the display panel 100. In the embodiment of the present disclosure, the first display region AA may be a normal display region, and the second display region CA may be a camera under panel region (CUP region). The second display region CA, as the CUP region, has a large transparent region (the light transmitting region TA), so as to provide a camera with sufficient light transmittance to photograph an image in an imaging mode state.

As shown in FIG. 1, the imaging optical module 2000 is corresponding to the light transmitting region TA of the second display region CA of the display device 1000, and light passes through the light transmitting region TA of the second display region CA for imaging. However, the second display region CA has structures such as circuits and pixels of display units arranged periodically. Because these structures are translucent or opaque structures arranged regularly, when light passes through this region and reaches the imaging optical module, the structures may produce an obvious diffraction effect and form diffraction spots, which may bring distortion of collected data and poor imaging of the optical module.

Therefore, the display device 1000 of the present disclosure further includes a first film layer, provided with a plurality of opaque or translucent particles PA arranged irregularly at a position corresponding to the light transmitting region TA of the second display region CA.

In the display device 1000 of the present disclosure, by adding the irregularly arranged opaque or translucent particles PA to the film structure corresponding to the light transmitting region TA, the irregularly arranged opaque or translucent particles PA are distributed between the regularly arranged pixels and circuits, thereby destroying the regular arrangement, further alleviating the diffraction phenomenon caused by the regular arrangement, and further having a better imaging effect. The plane position of the irregularly arranged opaque or translucent particles PA corresponding to the light transmitting region TA, and the size and shape thereof can be randomly generated using a random function.

In an embodiment of the present disclosure, as shown in FIG. 2, the first film layer is at least one of the first functional layer 200 or the second functional layer 300. That is, at least one of the first functional layer 200 or the second functional layer 300 is provided with a plurality of opaque or translucent particles PA arranged irregularly at the position corresponding to the light transmitting region TA.

To be specific, the first functional layer 200 may be at least one of a backplane, a heat dissipating copper foil, or a supporting stainless steel plate, and the first functional layer 200 is mainly configured to support and secure the display panel 100. The first functional layer 200 may form a pattern of translucent particles using laser dotting or a pattern of opaque or translucent particles using ink coating, so that the irregularly arranged opaque or translucent particles PA are arranged at the position corresponding to the light transmitting region TA.

The second functional layer 300 may be at least one of a touch panel, a polarizer, or cover glass. Similarly, the second functional layer 300 may form a pattern of translucent particles using laser dotting or a pattern of opaque or translucent particles using ink coating, so that the irregularly arranged opaque or translucent particles PA are arranged at the position corresponding to the light transmitting region TA.

Further, as shown in FIG. 2, the first film layer may further be any film layer disposed in the display panel 100.

It should be noted that although the irregularly arranged opaque or translucent particles PA are disposed in the first functional layer 200, the second functional layer 300, and the display panel 100 in FIG. 2, the irregularly arranged opaque or translucent particles PA may be disposed in only one or two of the layers, and may be disposed according to actual conditions.

It is to be understood that, in the embodiment shown in FIG. 2, the first film layer is formed by disposing the irregularly arranged opaque or translucent particles PA in original film layer structures (that is, the first functional layer 200, the second functional layer 300, and the display panel 100) of the display device 1000 at positions corresponding to the light transmitting region TA, so that the diffraction problem of the CUP technology of the full screen can be alleviated without adding an extra film layer structure, thereby further reducing the production cost.

Figure 3:
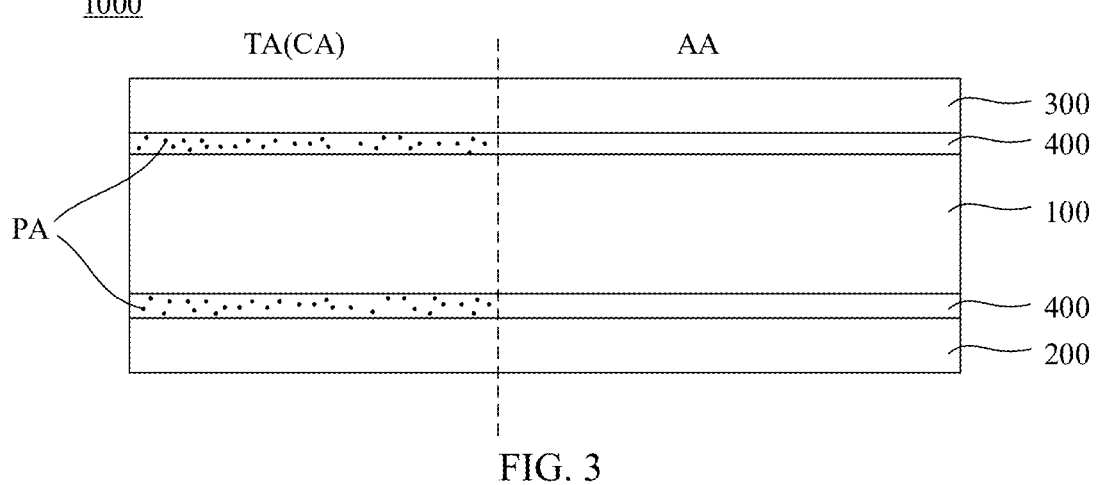
FIG. 3 is a schematic diagram of a cross-sectional structure of another display device according to an embodiment of the present disclosure.

As shown in FIG. 3, in another embodiment of the present disclosure, the first film layer 400 is located between at least one of between the first functional layer 200 and the display panel 100 or between the second functional layer 300 and the display panel 100.

In the present embodiment, the first film layer 400 may be formed independently, for example, the irregularly arranged opaque or translucent particles PA may be directly doped on a coating on which the first film layer 400 is to be formed to form the first film layer 400, and then the first film layer 400 may be attached to one side or two sides of the display panel 100. Therefore, the diffraction problem of the CUP technology of the full screen can be alleviated without complicated processing.

The materials of the opaque or translucent particles PA include metal particles, inorganic particles, organic particles, pigments, dyes, and other materials with opaque or translucent optical properties, which are not particularly limited in the present disclosure and can be disposed according to actual requirements.

Figure 4:
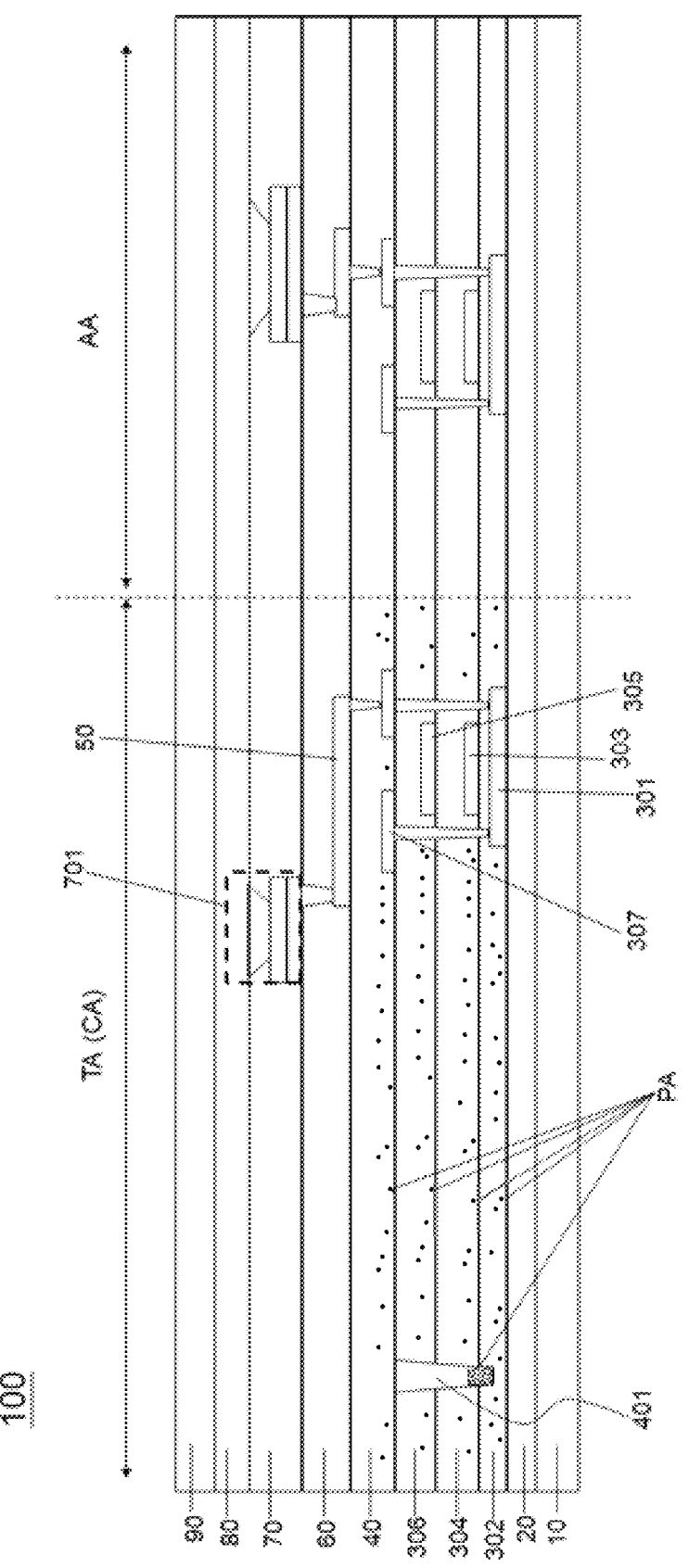
FIG. 4 is a schematic diagram of a cross-sectional structure of a display panel according to an embodiment of the present disclosure.

Further, as shown in FIG. 4, the display panel 100 includes a substrate 10, an active layer 301, a first insulation layer 302, a first gate metal layer 303, a second insulation layer 304, a second gate metal layer 305, a third insulation layer 306, a source-drain layer 307, and a first flat layer 40.

The active layer 301 is disposed on the substrate 10. The first insulation layer 302 covers the active layer 301. The first gate metal layer 303 is disposed on the first insulation layer 302. The second insulation layer 304 covers the first insulation layer 302 and the first gate metal layer 303. The second gate metal layer 305 is disposed on the second insulation layer 304. The third insulation layer 306 covers the second insulation layer 304 and the second gate metal layer 305. The source-drain layer 307 is disposed on the third insulation layer 306. The first flat layer 40 covers the third insulation layer 306 and the source-drain layer 307.

The substrate 10 may be a glass substrate or a flexible substrate, which is not particularly limited in the present disclosure.

The first insulation layer 302, the second insulation layer 304, and the third insulation layer 306 may be inorganic insulation layers, and the third insulation layer 306 may be configured to improve stress and replenish hydrogen sources, to further repair channel defects of a thin film transistor and improve electrical properties.

Further, the display panel 100 is provided with a buffer layer 20 between the active layer 301 and the substrate 10.

In an embodiment of the present disclosure, the first film layer is at least the active layer 301, and the active layer 301 is patterned and formed with irregularly arranged opaque or translucent particles PA at a position corresponding to the light transmitting region TA.

Specifically, the active layer 301 may be polysilicon, and when the first film layer is the active layer 301, the irregularly arranged opaque or translucent particles PA are translucent particles, and may be formed by patterning at same time when the active layer 301 is patterned to form a channel region. Therefore, the diffraction problem of the CUP technology of the full screen can be alleviated without adding an extra processing step, thereby having better imaging effect and reducing production cost.

In an embodiment of the present disclosure, the first film layer is in same layer as at least the first gate metal layer 303. That is, the first gate metal layer 303 is patterned and formed with the irregularly arranged opaque or translucent particles PA at the position corresponding to the light transmitting region TA.

Specifically, the first gate metal layer 303 may be molybdenum or an alloy thereof. When the first film layer is in same layer as the first gate metal layer 303, the irregularly arranged opaque or translucent particles PA are opaque particles, and may be formed by patterning at same time when the first gate metal layer 303 is patterned to form a first gate. Therefore, the diffraction problem of the CUP technology of the full screen can be alleviated without adding an extra processing step, thereby having better imaging effect and reducing production cost.

In an embodiment of the present disclosure, the first film layer is in same layer as at least the second gate metal layer 305. That is, the second gate metal layer 305 is patterned and formed with irregularly arranged opaque or translucent particles PA at a position corresponding to the light transmitting region TA.

Specifically, the second gate metal layer 305 may be molybdenum or an alloy thereof, and when the first film layer is the second gate metal layer 305, the irregularly arranged opaque or translucent particles PA are opaque particles, and may be patterned and formed at same time when the second gate metal layer 305 is patterned to form a second gate. Therefore, the diffraction problem of the CUP technology of the full screen can be alleviated without adding an extra processing step, thereby having better imaging effect and reducing production cost.

In an embodiment of the present disclosure, the first film layer is in same layer as at least the source-drain layer 307. That is, the source-drain layer 307 is patterned and formed with the irregularly arranged opaque or translucent particles PA at the position corresponding to the light transmitting region TA.

Specifically, the source-drain layer 307 may be titanium, aluminum or an alloy thereof, and when the first film layer is in same layer as the source-drain layer 307, the irregularly arranged opaque or translucent particles PA are translucent particles, and may be formed by patterning at same time when the source-drain layer 307 is patterned to form a source and a drain. Therefore, the diffraction problem of the CUP technology of the full screen can be alleviated without adding an extra processing step, thereby having better imaging effect and reducing production cost.

In an embodiment of the present disclosure, the third insulation layer 306 is provided with a plurality of first through holes 401 arranged irregularly at a position corresponding to the light transmitting region TA, the first film layer at least fills in the first through holes 401, is in same layer as and has same material with the first flat layer 40.

That is, the first film layer is formed by filling the first through hole 401 with the opaque or translucent particles PA and the first flat layer 40.

Specifically, the materials of the opaque or translucent particles PA include metal particles, inorganic particles, organic particles, pigments, dyes, and other materials with opaque or translucent optical properties. The first through holes 401 may be formed at same time when through holes connecting the source-drain layer 307 and the active layer 301 are formed. In addition, after being filled with the opaque or translucent particles PA, the first through holes 401 are then filled with the first flat layer 40, to form the first film layer. Therefore, the diffraction problem of the CUP technology of the full screen can be alleviated without adding an extra processing step, thereby having better imaging effect and reducing production cost.

It should be noted that although the irregularly arranged opaque or translucent particles PA are disposed in the active layer 301, the first gate metal layer 303, the second gate metal layer 305, the source-drain layer 307, and the first through holes 401 in FIG. 4, the irregularly arranged opaque or translucent particles PA may be disposed in only one or a plurality of the layers, and may be disposed according to actual conditions.

In an embodiment of the present disclosure, the first film layer is in same layer as at least two of the first functional layer 200, the second functional layer 300, and the film layers in the display panel 100, and the opaque or translucent particles located in different layers are staggered from each other in a top view.

Further, a shape of the irregularly arranged opaque or translucent particles PA includes at least one of a rectangle or a circle.

Further, a diameter or a side length of the irregularly arranged opaque or translucent particles PA is in a range of 1.5 μm to 10 μm.

It is to be understood that the size and shape of the irregularly arranged opaque or translucent particles PA at different plane positions can be randomly generated using a random function.

Further, the display panel 100 further includes a transparent metal layer 50, a second flat layer 60, a pixel definition layer 70, light emitting sub-pixels 701, a cathode layer 80, and a thin film packaging layer 90.

The transparent metal layer 50 is disposed on the first flat layer 40 and electrically connected to the drain via a through hole running through the first flat layer 40. The material of the transparent metal layer 50 may be indium tin oxide (ITO).

The light emitting sub-pixels 701 are located in an opening region where the pixel definition layer 70 is disposed and include an anode and a light emitting material layer, and the cathode layer 80 covers the light emitting sub-pixels 701 and the pixel definition layer 70.

The thin film packaging layer 90 is configured to isolate external water and oxygen to avoid failure of the display panel 100.

Further, the light emitting sub-pixels 701 include a red sub-pixel unit, a green sub-pixel unit, or a blue sub-pixel unit, wherein the red sub-pixel unit is configured to emit red light, the green sub-pixel unit is configured to emit green light, and the blue sub-pixel unit is configured to emit blue light.

Figure 5:
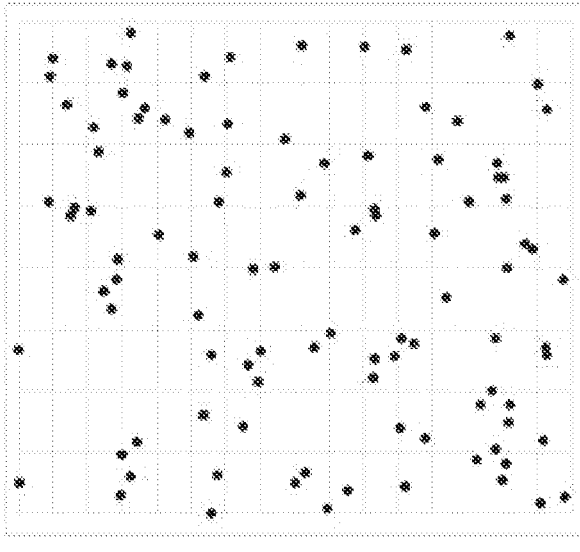
FIG. 5 is a schematic diagram of a distribution of irregularly arranged opaque or translucent particles according to an embodiment of the present disclosure.

FIG. 5 is a schematic diagram of a distribution of irregularly arranged opaque or translucent particles PA according to an embodiment of the present disclosure. As shown in FIG. 5, each grid in the figure represents one of the light emitting sub-pixels 701 and the black dots represent the opaque or translucent particles PA. In FIG. 5, the pixel size is taken as the minimum period (for example, the red sub-pixel unit and the green sub-pixel unit are taken as the minimum period or the blue sub-pixel unit and the green sub-pixel unit are taken as the minimum period), and the opaque or translucent particles PA are arranged in a unit of more than eight times of the minimum period, so as to achieve irregular arrangement. It should be noted that if the distribution of the opaque or translucent particles PA is set in units of eight times or less of the minimum period, this arrangement may cause new diffraction problems.

Figure 6:
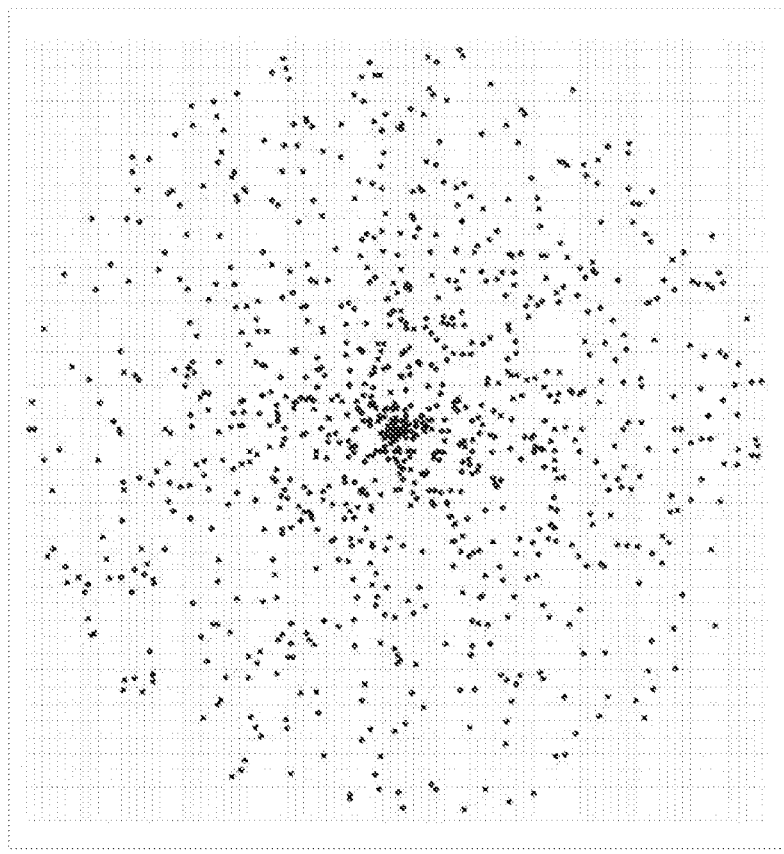
FIG. 6 is a schematic diagram of another distribution of irregularly arranged opaque or translucent particles according to an embodiment of the present disclosure.

FIG. 6 is a schematic diagram of another distribution of irregularly arranged opaque or translucent particles PA according to an embodiment of the present disclosure. As shown in FIG. 6, each grid in the figure represents one of the light emitting sub-pixels 701 and the black dots represent the opaque or translucent particles PA. The particle distribution in FIG. 6 is randomly generated using a random function directly over the entire region of the light transmitting region TA.

Therefore, in the display device 1000 of the present disclosure, by adding the irregularly arranged opaque or translucent particles PA to the film structure corresponding to the light transmitting region TA, the irregularly arranged opaque or translucent particles PA are distributed between the regularly arranged pixels and circuits, thereby destroying the regular arrangement, further alleviating the diffraction phenomenon caused by the regular arrangement, and further having a better imaging effect.

In the foregoing embodiments, description of each embodiment focuses on a different part, and for parts that are not described in detail in one embodiment, reference may be made to the related description of other embodiments.

The foregoing describes the embodiments of the present disclosure in detail, description is made on the principle and implementations of the present disclosure in this specification by using specific examples, and the description of the foregoing embodiments is merely used for helping understand the technical solutions and a core idea of the present disclosure. A person of ordinary skill in the art should understand that: modifications may be still made to the technical solutions recorded in the foregoing embodiments, or equivalent replacements may be made to some technical features, and these modifications or replacements do not cause the essence of the corresponding technical solutions to depart from the scope of the technical solutions of the embodiments of the present disclosure.

What is claimed is:

1. A display device, comprising:
a first functional layer;
a display panel, disposed on the first functional layer and comprising a first display region and a second display region, wherein the second display region comprises a light transmitting region;
a second functional layer, disposed on the display panel, and
an imaging optical module, disposed under the display panel and corresponding to the light transmitting region;
wherein the display device further comprises a first film layer, provided with a plurality of opaque particles arranged irregularly at a position corresponding to the light transmitting region of the second display region, wherein the opaque particles block light on the opaque particles from passing through; and
wherein the display panel comprises:
a substrate located on the first functional layer;
an active layer disposed on the substrate;
a first insulation layer disposed on the active layer;
a first gate metal layer disposed on the first insulation layer and comprising a first gate;
a second insulation layer disposed on the first insulation layer and the first gate metal layer;
a second gate metal layer disposed on the second insulation layer and comprising a second gate;
a third insulation layer disposed on the second insulation layer and the second gate metal layer; and
a source-drain layer disposed on the third insulation layer and comprising a source and a drain;
wherein the first film layer is at least one of the first gate metal layer, the second gate metal layer, and the source-drain layer.

2. The display device as claimed in claim 1, wherein the display panel comprises:
a first flat layer, covering the third insulation layer and the source-drain layer, wherein
the second functional layer is disposed on the first flat layer.

3. The display device as claimed in claim 2, wherein the first film layer has same material with the at least one film layer in the same layer.

4. The display device as claimed in claim 2, wherein the first film layer is at least two of the first gate metal layer, the second gate metal layer, and the source-drain layer, and the opaque particles located in different layers are staggered from each other in a top view.

5. The display device as claimed in claim 1, wherein a shape of the irregularly arranged opaque particles comprises at least one of a rectangle or a circle.

6. The display device as claimed in claim 5, wherein a diameter or a side length of the irregularly arranged opaque particles is in a range of 1.5 μm to 10 μm.

7. The display device as claimed in claim 1, wherein the first functional layer comprises at least one of a backplane, a heat dissipating copper foil, or a supporting stainless steel plate; and
the second functional layer comprises at least one of a touch panel, a polarizer, or cover glass.

8. A display device, comprising:
a first functional layer;
a display panel, disposed on the first functional layer and comprising a first display region and a second display region, wherein the second display region comprises a light transmitting region;
a second functional layer, disposed on the display panel, and
an imaging optical module, disposed under the display panel and corresponding to the light transmitting region;
wherein the display device further comprises a first film layer, provided with a plurality of opaque particles arranged irregularly at a position corresponding to the light transmitting region of the second display region, wherein the opaque particles block light on the opaque particles from passing through, and particle sizes of the irregularly arranged opaque or translucent particles are in a range of 1.5 μm to 10 μm;
wherein the display panel comprises:
a substrate located on the first functional layer;

an active layer disposed on the substrate;

a first insulation layer disposed on the active layer;

a first gate metal layer disposed on the first insulation layer and comprising a first gate;

a second insulation layer disposed on the first insulation layer and the first gate metal layer;

a second gate metal layer disposed on the second insulation layer and comprising a second gate;

a third insulation layer disposed on the second insulation layer and the second gate metal layer; and a source-drain layer disposed on the third insulation layer and comprising a source and a drain;

wherein the first film layer is at least one of the first gate metal layer, the second gate metal layer, and the source-drain layer.

9. The display device as claimed in claim 8, wherein the display panel comprises:

a first flat layer, covering the third insulation layer and the source-drain layer, wherein the second functional layer is disposed on the first flat layer.

10. The display device as claimed in claim 9, wherein the first film layer has same material with the at least one film layer in the same layer.

11. The display device as claimed in claim 9, wherein the first film layer is at least two of the first gate metal layer, the second gate metal layer, and the source-drain layer, and the opaque particles located in different layers are staggered from each other in a top view.

12. The display device as claimed in claim 8, wherein the first functional layer comprises at least one of a backplane, a heat dissipating copper foil, or a supporting stainless steel plate; and the second functional layer comprises at least one of a touch panel, a polarizer, or cover glass.

\* \* \* \* \*